United States Patent [19]
Singkornrat et al.

[11] Patent Number: 5,828,862
[45] Date of Patent: Oct. 27, 1998

[54] GAME PROGRAMMING FLASH MEMORY CARTRIDGE SYSTEM INCLUDING A PROGRAMMER AND A REPROGRAMMABLE CARTRIDGE

[75] Inventors: Paripon Singkornrat, Boca Raton; Don E. Basnett, Jr., Pompano Beach; John Dorak, Boca Raton; Glen E. Hamblin, Boca Raton; Kha D. Nguyen, Boca Raton; James T. Tsevdos, Fort Lauderdale; Donald J. Watzel, Coral Springs, all of Fla.

[73] Assignee: International Business Machines Corporation, Armonk, N.Y.

[21] Appl. No.: 855,478

[22] Filed: May 13, 1997

Related U.S. Application Data

[63] Continuation of Ser. No. 238,112, May 4, 1994, abandoned.
[51] Int. Cl.⁶ ............... G06F 13/00; G11C 7/00
[52] U.S. Cl. ............ 395/442; 395/430; 365/52; 463/44
[58] Field of Search ................... 395/430, 442; 365/52, 63; 364/410; 273/148 B; 463/43, 44, 45, 46, 47

[56] References Cited

U.S. PATENT DOCUMENTS

| | | | |
|---|---|---|---|
| 4,593,376 | 6/1986 | Volk | 365/52 |
| 4,620,707 | 11/1986 | Lippincott | 463/44 |
| 4,680,731 | 7/1987 | Izumi et al. | 365/52 |
| 4,725,977 | 2/1988 | Izumi et al. | 395/442 |
| 5,251,909 | 10/1993 | Reed et al. | 364/410 |
| 5,388,841 | 2/1995 | San et al. | 463/44 |
| 5,395,112 | 3/1995 | Darling | 463/44 |
| 5,396,225 | 3/1995 | Okada et al. | 273/148 B |
| 5,418,713 | 5/1995 | Allen | 364/403 |

*Primary Examiner*—Glenn Gossage
*Attorney, Agent, or Firm*—Morgan & Finnegan, L.L.P.; Joseph C. Redmond, Jr.; JoAnn Crockatt

[57] ABSTRACT

A game programming system uses rewritable cartridges that are compatible with commercially available game systems to produce game cartridges at a point-of-sale location so that retailers only need to stock sufficient uniquely designed game blanks to meet consumer demand. A game programmer or programming device loads digital content from computer storage to a rewritable game cartridge incorporating reprogrammable flash memory. The system includes flash rewritable cartridge identification hardware that allows verification of the cartridge to identify it as proprietary to a particular manufacturer or authorized dealer. The system provides for game content to be erased from the cartridge and new game content to be programmed so that the cartridge can be reused time after time to house any number of programs. During a cartridge write operation, a game programmer interface accepts data stored in a personal computer (PC) and fills first in first out (FIFO) memory. A sequencer generates addresses, proper commands, control signals, and timing signals, and sends the game content from the FIFO memory to the game programmer which passes the information to the reprogrammable game cartridge. The sequencer enables the game programming system to write data to the reprogrammable game cartridge very rapidly. The game programmer provides an interface between the game program storage and reprogrammable game cartridge. The programmer may include multiple slots or sockets and accommodate cartridges from different manufacturers with different game formats.

17 Claims, 10 Drawing Sheets

GAME PROGRAMMING FLASH MEMORY CARTRIDGE SYSTEM INCLUDING A PROGRAMMER AND A REPROGRAMMABLE CARTRIDGE

This is a continuation of application Ser. No. 08/238,112, filed on May 4, 1994, now abandoned.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

Field of the Invention

The present invention relates to the field of video and audio data storage and controlled production of information, and in particular to systems for manufacturing on-demand video and audio cartridges for use interactively, particularly in video game systems.

Today there are over 50 million video game players in the United States of America alone. The rental and retail of video game cartridges have evolved into a major market as the number of new games has grown to more than 2,000 titles and game prices continue to rise. Consumer studies show that one of the biggest areas of dissatisfaction among game renters and buyers is the difficulty of finding their game choice in stock. Game retailers find it difficult to accurately forecast demand for video games because there are usually no archival records to use as a base. Popularity often rises through the informal "word of mouth" networking among game players. In addition, the window of opportunity for a particular game is very short. A retailer who purchases enough game cartridges to meet peak demand may be left with unsold game cartridges when demand diminishes. The opposite problem occurs when a retailer did not purchase enough game cartridges to meet demand. In this case more cartridges will have to be ordered from the manufacturers. This process could lead to loss of revenue due to very long lead times because the cartridges, which contain mask programmable read only memory (MPROM), are usually produced in limited manufacturing runs and often overseas which delays delivery to the retailer.

Presently, retailers must predict consumer demand for MPROM based game cartridges for the game cartridge rental and retailing business. Usually the prediction is not very accurate particularly if it involves a new game title that has no previous marketing record. Retailers are forced to overstock or understock game cartridges resulting in cash flow problems or loss of sales, both causing loss in total profit. If retailers overstock then they may end up with unusable inventory because MPROM game cartridges are not alterable. On the other hand, understocking causes loss in rental or sale revenue because retailers cannot satisfy consumer demand. Further, the efficiencies of programming MPROM, or reprogramming eraseable programmable read only memory (EPROM) or electrically eraseable programmable read only memory (EEPROM) are such that they are not ideal for on-demand retailing operations.

SUMMARY OF THE INVENTION

The game programming system uses rewritable cartridges that are compatible with commercially available game systems (for example, Sega and Nintendo systems) to produce game cartridges at the point-of-sale or rental location. It satisfies the renter or buyer by providing just in time delivery of the desired game. Retailers only have to keep sufficient uniquely designed game blanks on hand to meet consumer demand. No popularity forecast of any particular game title is necessary.

The invention is comprised of a programming device specifically designed to load digital content from computer storage to program a rewritable game cartridge in an extremely short period of time. The game cartridge is of a design that uses reprogrammable flash memory instead of the traditional MPROM or even EPROM or EEPROM. The combination of the unique flash memory concept and the programming device enables this system to program a rewritable game cartridge in less than 30 seconds. Therefore a game cartridge can be manufactured on-demand resulting in greater customer satisfaction. The retailers only have to stock rewritable cartridges utilizing flash memory with its more idealistic features.

The flash rewritable cartridge also contains identification hardware that allows the programmer to verify it as proprietary to a particular manufacturer or authorized distributor or retailer. The programmer is able to program only those cartridges that are correctly identified thus allowing stringent quality control of the manufacturing process. After the programmer identifies a cartridge as usable, the operator has the option to initialize the cartridge and input additional information such as store location and cartridge type into the flash memory. If initialization is not necessary, then the operator can instruct the programmer to begin loading data from storage to the cartridge.

The flash reprogrammable cartridge readily lends itself to the rental business where a game can be programmed on a cartridge and rented to a customer. The game content can be erased from the cartridge when it is returned, new game content can be programmed and the cartridge can be rented a successive number of times. A sell-through scenario is also envisioned and may present the customer with the opportunity to bring an owner's purchased cartridge back to be reprogrammed with a new game title. When flash memory becomes less expensive for cartridge inclusion and sale, a greater profit can be made by programming large numbers of cartridges on demand and selling them to customers. If flash memory prices are relatively high, a sell-through is most feasible by first selling an empty cartridge to a customer, then programming it with the desired game content for an additional fee. After a period of time the customer may tire of the game and desire a new game. In such a case the cartridge is brought back and a new game is purchased but without purchasing a new blank cartridge. This then saves the hardware cost when a customer purchases a new game.

Certain novelties and advantages that the game programming system provides include on-demand swift programming of specially designed cartridges, satisfying consumer needs, programming only those cartridges verified as of proprietary design, programming many types and densities of cartridges, provision for retailers stocking only blank cartridges and never running out of any game title, down loading new game content from remote control server sites to enable immediate distribution of new game titles to retail locations, remote programming of cartridges, where a game programmer box can be many feet from the personal computer (PC), controlling multiple game programmer boxes by a single PC to save cost and providing a new tool to the store manager to perform analysis of the game business, including identifying popular games, monitoring daily transactions and days of rental and providing inventory analysis (listing cartridges by type and/or density).

BRIEF DESCRIPTION OF THE DRAWING(S)

Other objects and advantages of the invention will be apparent from the following description taken in connection with the accompanying drawings wherein.

DESCRIPTION OF THE ILLUSTRATIVE EMBODIMENT(S)

Figure 1:
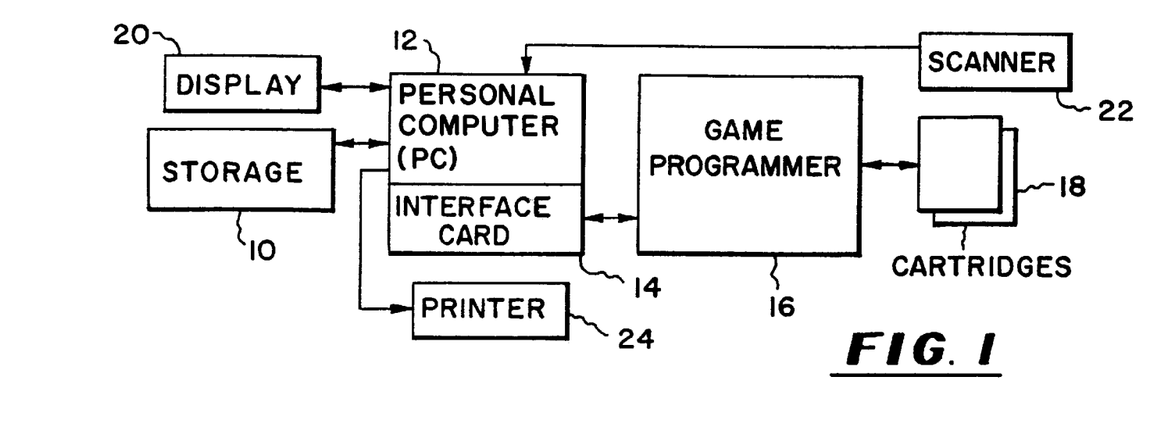
FIG. 1 is a block diagram of a game programming system in accordance with the principles of the present invention.

The game programming system of FIG. 1 comprises a storage subsystem 10, a personal computer (PC) 12, such as an International Business Machines Corporation (Armonk, N.Y.) (IBM™) PS/ValuePoint™ Mod. No. 6384L00 with 527 megabyte (MB) hard drive equipped with a game programmer interface card 14 that is attached to an external game programmer box 16. The innovative concept is integral to the game programmer interface card 14, the game programmer 16, and the programming of a reprogrammable game cartridge 18.

The game interface card 14 provides communication and data transfer between the personal computer 12 and the game programmer 16. The interface card 14 communicates with PC 12 on a 16 bit bus. The interface card 14, as seen in greater detail in FIG. 4, contains an address buffer 56, data buffer 58, controls 60, FIFO (first in, first out) memory 62, a status register 61 for recording data transfer status, and a sequencer 64. In a read operation, the game interface card 14 obtains information from the reprogrammable game cartridge 18 plugged into the game programmer at connector 40 (shown in FIG. 2). The information is passed through the game programmer 16 and then directly on to the PC 12. The PC 12 uses this information to determine the cartridge type and whether it is of a predetermined type, configuration and quality for use by the programming system.

Figure 3:
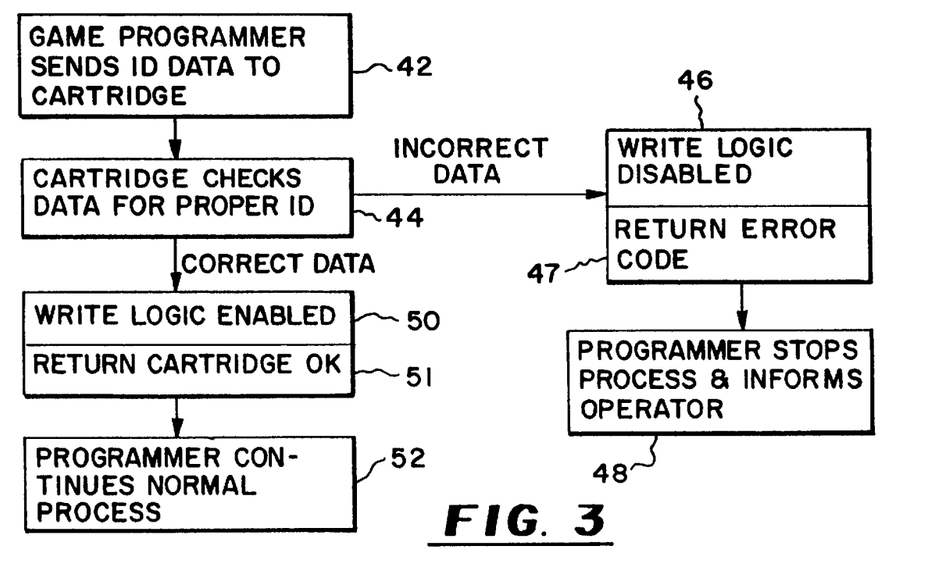
FIG. 3 is a logic flow diagram for the cartridge and game programmer, as illustrated in FIG. 1.

To provide a unique check for proprietary and quality designed game cartridges, a programmable array logic (PAL) or a generic array logic (GAL) is used as identification hardware 38 is programmed to enable the flash memory 30 and 32 of the cartridge 18 for writing, if and only if the "correct" data stream is sent from the game programmer 16 to the game cartridge 18, as best seen in FIG. 3. The PAL 38 will also send back a "cartridge verified" signal to the game programmer 16. This arrangement accomplishes two goals, a) the game programmer 16 will program only proprietary cartridges and b) other game programmers cannot program proprietary cartridges unless they know the unique data stream that must be provided.

As seen in FIG. 3, at step 42 the game programmer 16 sends identification data to the cartridge 18. At the cartridge 18, the data is checked as seen at step 44. If incorrect data is present, an incorrect data signal is sent to the write logic of the sequencer 64 which is disabled at step 46 and a return error code is sent to the game programmer 16 at step 47 which provides for the programmer 16 to stop the process at step 48. If the cartridge identification data is verified, then the write logic is enabled at step 50, a return cartridge OK code is sent to the game programmer 16 at step 51, and the game programmer 16 continues the process through step 52.

Figure 2:
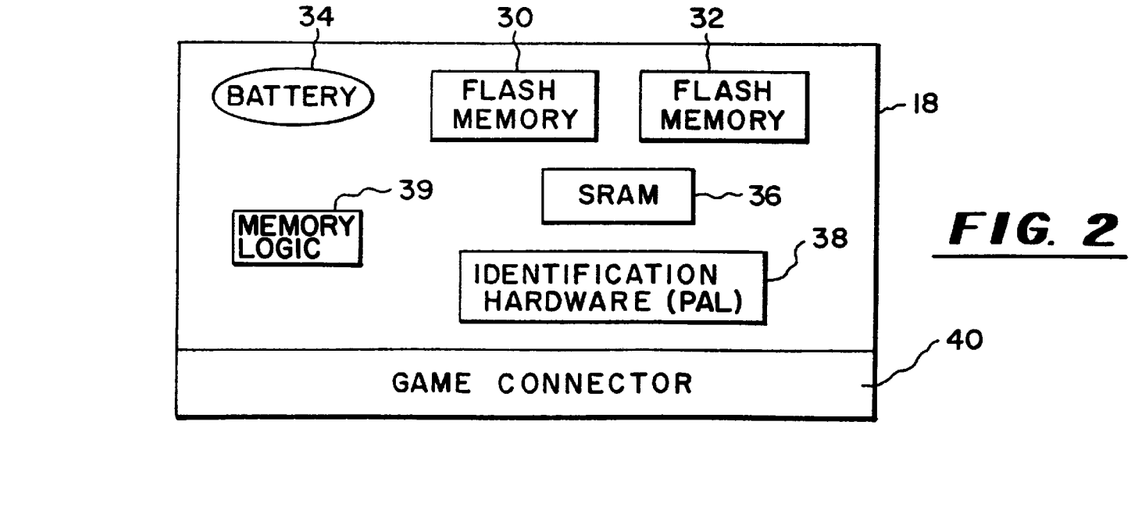
FIG. 2 is a block diagram of the reprogrammable cartridge, as illustrated in FIG. 1.

As further illustrated, in FIG. 2 the reprogrammable game cartridge 18 includes one or more flash memory chips 30 and 32. The illustrated embodiment of the cartridge design with flash memory 30 and/or 32 can be programmed in less than 30 seconds.

The flash memory chips 30 and 32 also hold retailer usable information such as store identification and cartridge type. The store manager or user application can input this information at cartridge initialization. A battery 34 providing backup for a static random access memory (RAM) (SRAM) 36 are optional and dependent on the requirement of a specific game. Typically, the battery 34 and SRAM 36 are used to hold player scores and other like tally results. The cartridge 18 contains unique identification hardware 38 such as the PAL that identifies it to a particular manufacturer, authorized distributor or retailer. Logic 39 functions to select between the flash memory 30 and 32 and the SRAM 36.

Figure 4:
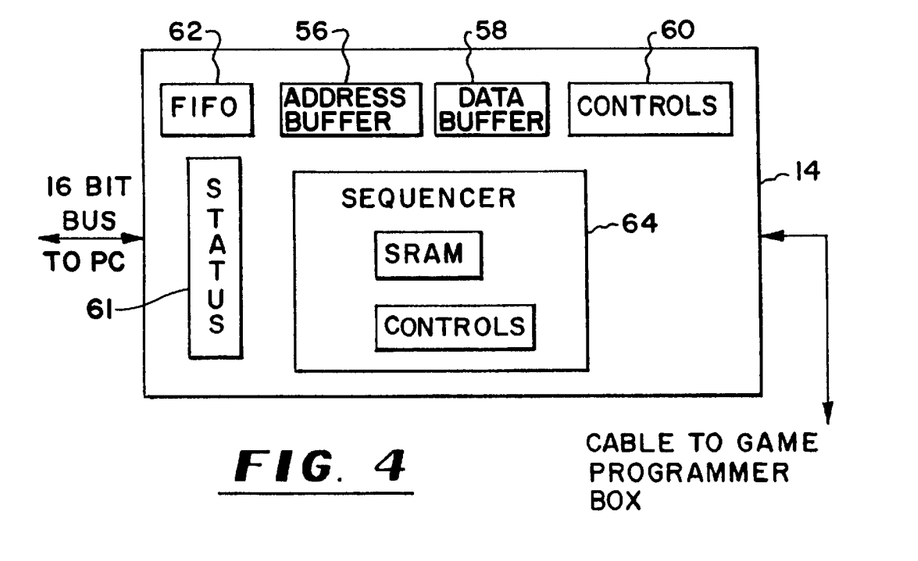
FIG. 4 is a block diagram of the game programmer interface card, as illustrated in FIG. 1.

During a cartridge write operation, the game programmer interface card 14 accepts data from the PC 12 and fills the FIFO memory 62 in the interface card 14. The sequencer 64 in the card 14 generates addresses, proper commands, control and timing signals, and sends the game content from the FIFO memory 62 to the game programmer 16 which in turn passes the information to the reprogrammable game cartridge 18. It is the sequencer 64 in the interface card 14 that enables this game programming system to write data to the reprogrammable game cartridge 18 very rapidly.

The game programmer 16 provides an interface between the game programmer interface card 14 and reprogrammable game cartridge 18. This programmer 16, as seen in more detail in FIG. 5, comprises electronic hardware and physical interface 70, including cables. The programmer is adapted to accommodate the plug-in of a number of reprogrammable game cartridges 18 at slots 65, 66, 67 and 68. Cartridges from different manufacturers and game formats have different densities and form factors.

Figure 5:
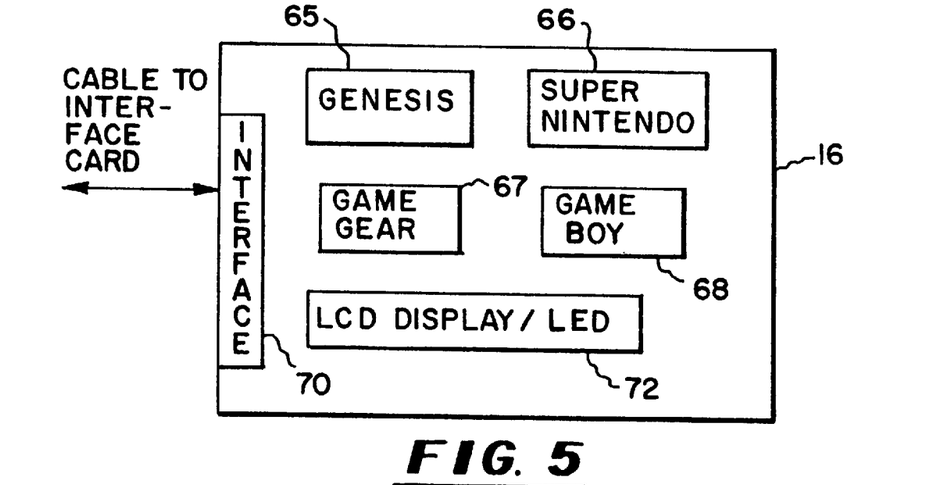
FIG. 5 is a block diagram of the game programmer, as illustrated in FIG. 1.

For example, a Sega Genesis™ cartridge will not fit into a slot made for a Super Nintendo Entertainment System (SNES™). Moreover, each type of cartridge has different electrical connections. Therefore, four separate slots 65, 66, 67 and 68 are provided in the game programmer 16 or an interposed cartridge adapter is included to accommodate, for example, multiple game formats. Those could include (a) Sega Genesis slot 65, (b) Nintendo SNES slot 66, (c) Sega Game Gear™ slot 67, and (d) Nintendo Game Boy™ slot 68. More slots can be added to accommodate other formats. Density denotes how much a memory chip or cartridge can hold. Higher density means that more bits are available for use by the video game.

The game programming system provides on demand programming of rewritable flash memory game cartridges for the rental and retail business. Flash memory semiconductor technology was introduced by Intel Corporation in 1988. At the semiconductor technology level Intel's ETOX™ (EPROM tunnel oxide) flash memory is based upon a single transistor EPROM cell. This technology provides a high-density, truly nonvolatile and high performance read-write memory solution. The main characteristics of this memory are low power consumption, extreme ruggedness, and high reliability. Low power consumption is particularly evident when compared to other erasable PROM technologies, such as EEPROM and EPROM.

Flash memory technology utilizes a one-transistor cell, providing increased densities, scalability, higher reliability and lower cost, while taking advantage of in-system mass electrical erasability. Moreover, flash memory offers distinct advantages when compared to other solid state memory technologies. For example, in comparison with electrically erasable programmable read-only memory (EEPROM), EEPROM, while being non-volatile is also electrically byte-erasable. This requires a more complex cell structure, resulting in significant different features and capabilities including a limited capacity vs density, lower reliability and higher cost. These make it unsuitable as a mainstream memory. Thus the cell structure of an EEPROM is more complex, (i.e. contains more parts/data-stored) than flash memory. Moreover, when programming EEPROM, it takes about 10 ms (milli-seconds) to write to each location or cell. When programming flash, memory, it takes only 9 µs (microseconds) to program each location. In the illustrated instance, with flash memory 30 and 32 (each 8 bits wide, and when addressed, accessed in parallel for 16 bits), two megabytes may be programmed in less than 10 seconds. This is approximately three orders of magnitude faster than EEPROM.

In an embodiment of the present system, two 8 megabit flash memory chips (Intel™ 28F008SA) are used. This gives 2 megabytes of storage in a single cartridge. Note that the game programmer 16 can handle up to 16 megabytes and should satisfy most memory requirements for game cartridges. The game programmer 16 can also be redesigned without difficulty to accommodate memory cartridges with higher density should that need arise. Time for programming a cartridge has been drastically reduced to less than 30 seconds so that a customer may wait for the product while it is being programmed without feeling unduly delayed.

Figure 6:
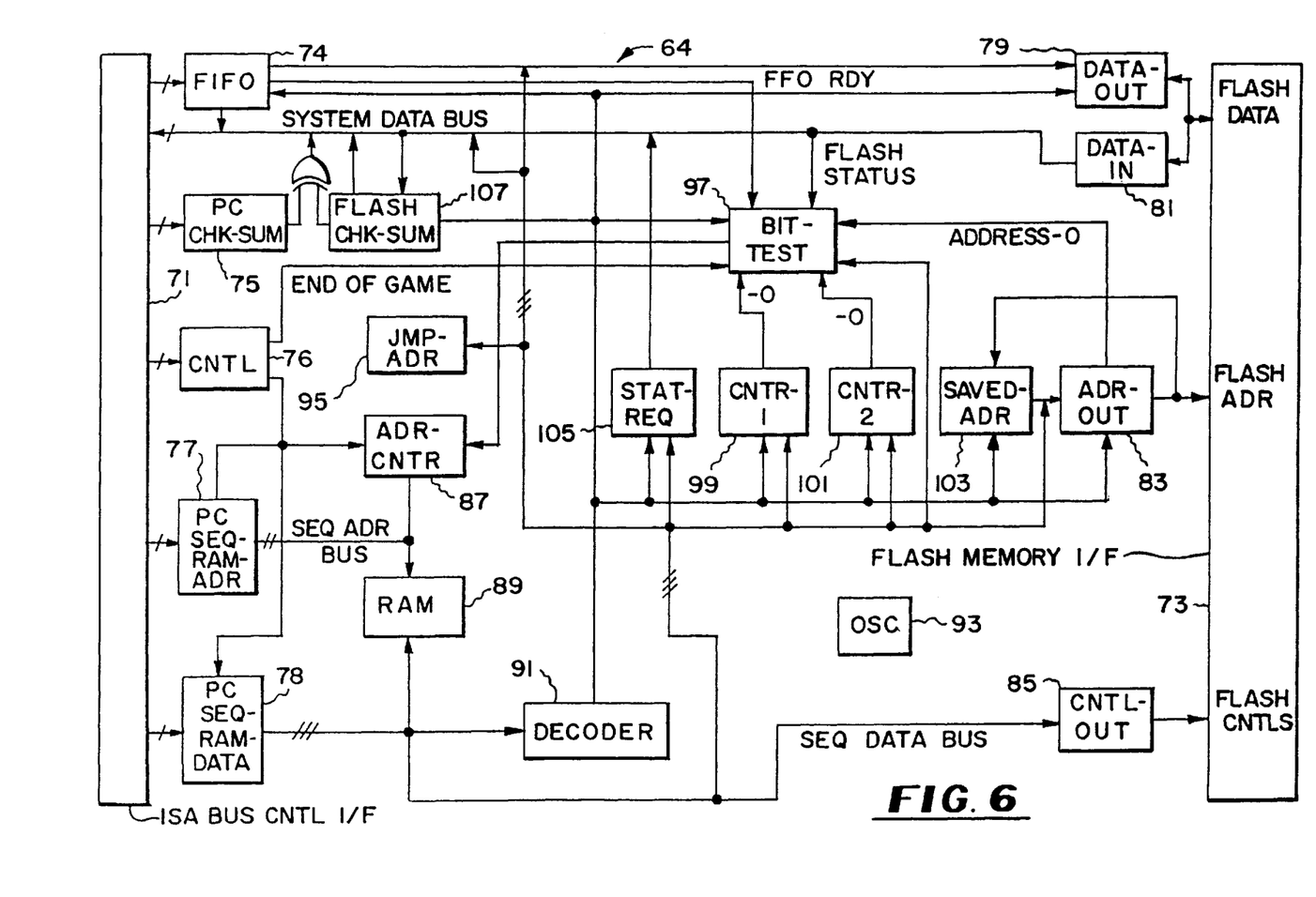
FIG. 6 is a block diagram for the game sequencer as illustrated in FIG. 4.

The sequencer (SEQ) 64 of the game interface card 14 is best illustrated in FIG. 6. The Industry Standard Architecture Interface (ISA I/F) or ISA bus interface includes the ISA BUS CONTROL I/F 71 and provides control logic to the interface between the ISA bus and SEQ 64. FLASH MEM I/F 73 provides the flash memory input/output (I/O) signals. FIFO 74 (or, as shown in FIG. 4, FIFO 62), is used by the ISA bus to load game data while the SEQ 64 is carrying out the programming of the flash memory 30, 32. The SEQ 64 off-loads the data one by one or in a parcelling manner when the FIFO 74 is not empty. PC CHKSUM 75, which is hereinafter further explained, holds game checksum which was calculated and loaded by software on the PC. CNTL 76 is used by the PC software to signal SEQ 64 to start the programming process and to let SEQ 64 know when the End-of-Game occurs and is sent forth on the internal control line. PC SEQ-RAM-ADR 77 is used by PC software to address the SEQ 64 RAM 89 locations. PC SEQ-RAM-DAT 78 is used by PC software to write data to the SEQ 64 RAM 89 locations.

The SEQ I/F includes the DATA-OUT 79 which functions to place FIFO-data from FIFO 74 to place a command on Flash Memory I/F data bus 73. DATA-IN 81 is used by the receive data or status from Flash Memory I/F 73. ADR-OUT 83 functions to allow the SEQ 64 to generate addresses to access flash memory 30 and 32. CNTL-OUT 85 is used by the SEQ 64 to generate control signals to flash memory 30 and 32.

The sequence engine includes ADR-CNTR 87 which accesses the internal code of SEQ 64 which is stored in RAM 89 and which functions as the code address counter. The RAM 89, as stated, holds the SEQ 64 internal code. This code is loaded by the PC software after power-on-reset (POR). It is also read back and verified by the PC software to ensure that the content was loaded correctly. The DECODER 91 decodes the SEQ engine code and generates the appropriate control signals to other registers. OSC 93 is an oscillator which generates a clock for the entire SEQ engine. JMP-ADR 95 acts to hold the jump-address of the code location. The BIT-TEST 97 is used by the SEQ 64 to test various hardware status and to determine branch conditions for the SEQ internal code. If BIT-TEST 97 is true, i.e. if test BIT-TEST 97 determines that a branch condition exists, it causes the controls of JMP-ADR 95 to be loaded into the ADR CNTR 87. CNTR-1 99 is used by the SEQ 64 as a general purpose counter and functions as, e.g., a timer, byte count, loop count and delay. CNTR-2 101 is similarly used by the SEQ 64 as a general purpose counter and functions also as a timer, byte count, loop count and delay. A SAVED-ADR 103 is used by SEQ 64 to save the current flash address for later use. While STAT-REG 105 is used by the SEQ 64 to send status to the PC software, the FLASH CHK-SUM 107 is used by the SEQ 64 to do hardware game checksum calculation and compare it with PC CHIK-SUM 75.

The BUSES of the sequencer (64), as illustrated in FIG. 6, include the SYSTEM DATA BUS marked with a single hash mark across the bus line. This system data bus is accessible by the PC software. As an input to the PC software, it is multiplexed from Flash-Data-Bus and SEQ-Status-bus. As an output from the PC software, it is the ISA Data-Bus. The SEQ ADR BUS is marked with a double hash mark. This is the SEQ RAM Address bus, which accesses the SEQ engine code in RAM 89. The SEQ DATA BUS is marked with triple hash marks. This SEQ data bus has Ob-code-field, Data-field and Control-field. The Ob-Code-field contains the SEQ engine code (or object code) received from the RAM 89 and is sent to the decoder 91 as an instruction. The Data-field is sent to the registers, counters 99, 101 and register 105, as data, for example. The Control-field is sent directly to the flash memory 30 and 32 as control signals. The Control-field is independent from other fields that is, it can change without affecting other fields' operations. The Ob-code-field normally operates with the Data-field. It is also possible to operate without Data-field, i.e., the SAVED-ADR 103 or FIFO 74 can operate without Data-field. Data-field does not work by itself. Registers that can execute in one instruction are FLASH CHK-SUM 107, SAVED-ADR 103, ADR-OUT 83 which can do an increment, DATA-IN 81 which can do a low byte select and CNTR-1 99 and CNTR-2 101 which can do a decrement or increment.

The software interface provides for adapter communication being executed through Port I/O using a single port for all read, write, erase, liquid crystal display (LCD), display/light-emitting diode (LED) 72 (FIG. 5), and status operations. Write operations use the on-board sequencer 64 and FIFO 62 hardware to write data to the flash memory cartridge 18. Since the size of the hardware FIFO 62 is 2 KB, all write requests are executed using 1 KB blocks, using a flip-flop method for increased performance that is, using a first 1 KB of the FIFO 62 and then a second 1 KB of the FIFO 62 for writing succeeding 1 KB blocks of data to the flash memory cartridge 18. Once the data reaches the FIFO 62, the on-board sequencer 64 reads the FIFO 62 and transfers the data to the flash memory cartridge 18. During the write operation the hardware will accumulate a simple 8-bit checksum. When the write operations are completed, the checksum is compared to a software checksum to verify the write operation. In addition, during the write operation the device driver will be checking a write status signal after each data transfer for run-time errors. Write LCD/LED operations are executed using Port I/O on the interface card 14.

Read operations read data directly from the flash memory chips 30 and 32 via the I/O Port and erase operations use the "Flash-Specific" block erase command. The erase commands are unique to each type of flash memory chip.

Software operations using multiple interface cards 14 in a single PC 12 can be synchronous or asynchronous depending on the operating system platform. Software operations on a single interface card 14 attached to game programmer 16 with multiple game cartridges 18 slots 65, 66, 67 and 68 are synchronous. Therefore multiple operation requests to a single interface card 14 are blocked or serialized by software semaphores in a device driver rather than a more complex hardware design. For the hardware microcode driver design, the sequencer 64 on the PC interface card 14 requires a downloadable set of microcode to accommodate data transfer operations between the FIFO 62 and the flash memory 30 and 32. This is the microcode that will control the various game cartridge formats of the game programmer 16 supported by the game manufacturing system. This micro code is downloaded by the game system device driver 116 which also passes commands and data to the sequencer 64 via the card FIFO registers 62. The sequencer internal code controls the following functions: writing of data from the FIFO registers 62 to the flash memory 30 and 32; calculation and comparison of data checksum to verify write operations; and reading of data from flash memory 30 and 32 to the FIFO registers 62.

The advantage of using a sequencer 64 in this application is that the sequencer code can be modified to suit different types of writable read-only memories (ROMs). The sequencer microcode is created much like standard assembly language wherein the steps include the first step of creating a source code file using pre-defined opcodes and operands, and the second step of assembling source code file using GASM.EXE (game assembler).

The GASM.EXE command creates two output files from the original source code file. The first is similar to a standard assembler listing (filename.LST), and the second file is the binary sequencer microcode (BSM) file and assumes the BIN extension. One BSM file will exist for each game cartridge type, and all appropriate BSM files will be downloaded to the PC interface card 14 during the device driver initialization process.

The hardware and software component definition and installation is set forth as follows and is further explained with regard to FIG. 7:

| Module | Description | Location |
|---|---|---|
| FLRSYS.LIB | Export library for 32-bit Flash Memory System API's | LIB |
| FLRSYS.DLL | Dynamic Link Library for 32-bit Flash Memory System API's | LIBPATH |
| FLRIOPL.LIB | IOPL (Ring 2, 16-bit) Flash Adapter Driver | LIB |
| FLRIOPL.DLL | IOPL (Ring-2, 16-bit) Flash Adapter Driver Dynamic Link Library | LIBPATH |
| FLRSYS.H | Flash API, error code, and constant definitions | INCLUDE |
| CFG.DLL | Flash Memory System Support API's | LIBPATH |
| FLRSYS.INI | Flash Driver initialization file (used by FLRSYS.DLL) w/FLRSYS.DLL | |

Figure 7:
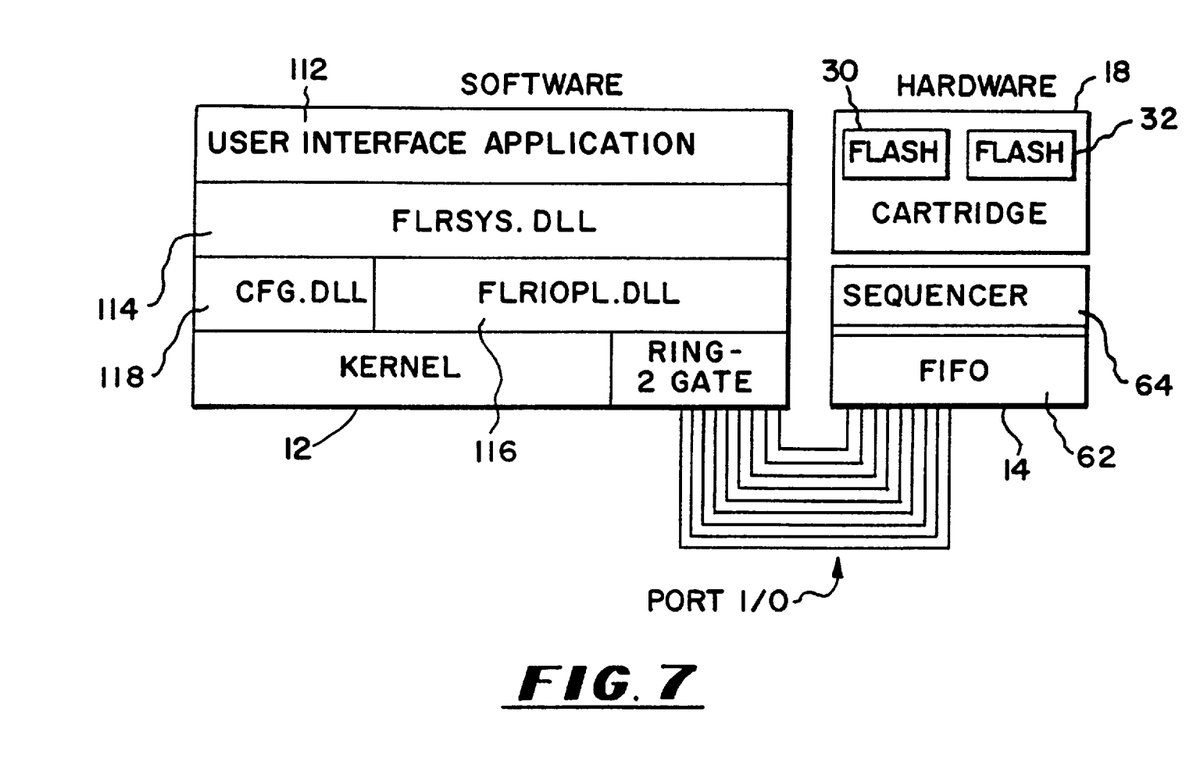
FIG. 7 is a block diagram for the software driver design of the hardware FIFO, sequencer and cartridge.

The LIBPATH variable for the modules FLRSYS.DLL, FLRIOPL.DLL and CFG.DLL, respectively blocks 114, 116 and 118 in FIG. 7, is defined in Operating System 2 (OS/2™) 2.x Config.Sys File.

The software driver design employs a strategy, as illustrated in FIG. 7, using a Ring-3 32-bit dynamic link library (FLRSYS.DLL) 114 as the software link between the user application 112, comprising, for example, the LCD display 72 or a keyboard, and the flash memory driver (FLRIOPL.DLL) 116. The FLRIOPL.DLL is a Ring-2 16-bit IOPL (input/output privilege level) driver that communicates with the PC interface card 14 using Port I/O, as shown in FIG. 7.

Figure 8:
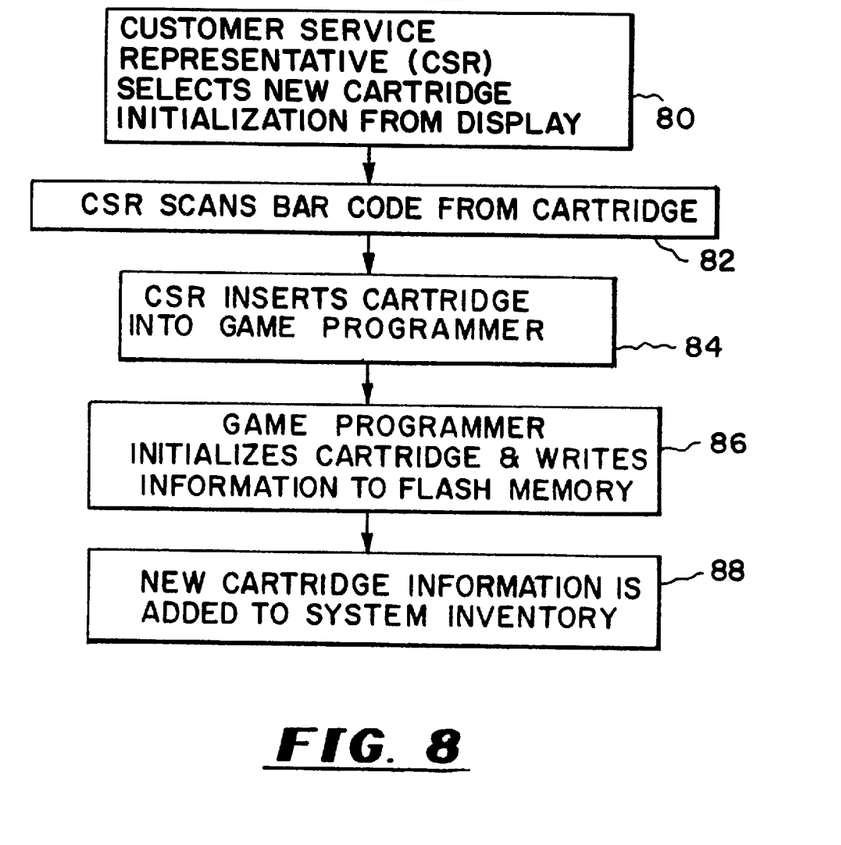
FIG. 8 is a logic flow diagram of an initialization process for the reprogrammable cartridge, as illustrated in FIG. 1.

The following scenarios explain how the game programming system of FIG. 1 is used. A new cartridge initialization procedure, as illustrated and further described in FIG. 8, includes the steps of a customer service representative (CSR) selecting new cartridge initialization from the display 20 at step 80. The CSR uses the scanner 22 to scan a bar code from the cartridge 18 at step 82. Generally, new unprogrammed cartridges will have bar code indicia on them with the following category information: (1) the store I.D.; (2) kind of cartridge, i.e. Sega, Nintendo, etc. and (3) a cartridge serial number. This information is programmed into a portion of the cartridge flash memory 30 and 32 by the initialization technique (either bar code or computer keyboard etc.). This would normally be done by the business operation in advance of the need for the cartridges. The cartridges are then put into their appropriate bins awaiting usage (i.e. a customer orders a game). Game cartridges that are going to be reused could also be placed in the same bins, because the category numbers associated with the cartridge would already be placed in the cartridge. Other information that would or could be placed in this section of the memory would be the game identification. This would occur when the Custmer Service Representative instructs the manufacturing machine to download a specific game. The Customer Service Representative inserts the cartridge 18 into the appropriate slot in the game programmer (GP) 16 for engagement of the cartridge game connector 40 (FIG. 2) at step 84. As previously provided for at step 44 of FIG. 3 the cartridge 18 identification check is made. The Game Programmer then initializes the cartridge 18 and writes bar code information into the cartridge flash memory 30 and 32 at step 86 thereby automatically adding new cartridge information to the system's inventory in storage 10 at step 88.

Figure 9:
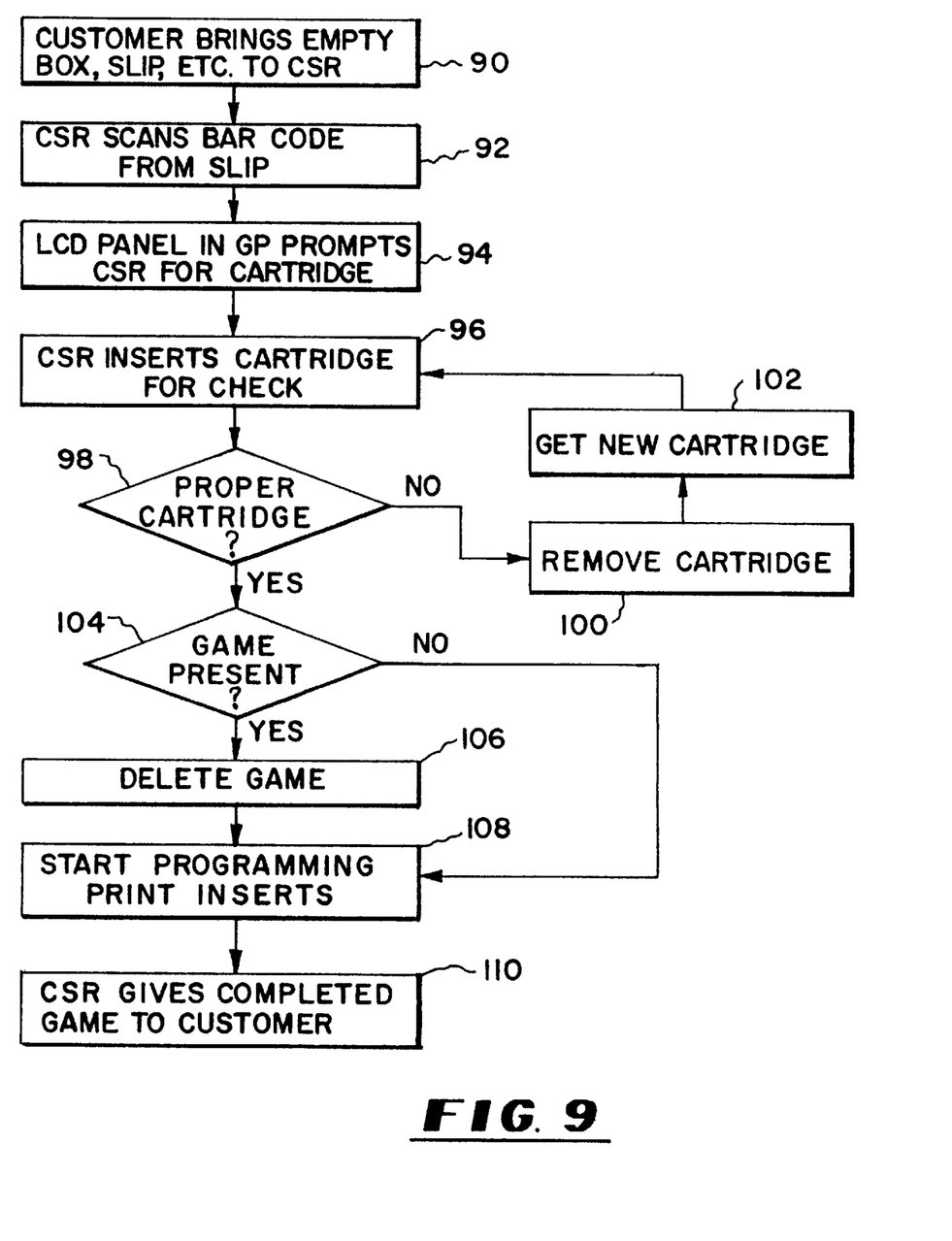
FIG. 9 is a logic flow diagram of an on-demand manufacturing process of the reprogrammable cartridge, as illustrated in FIG. 1.

The on demand game manufacturing, as illustrated and further described in FIG. 9, includes the steps of a customer bringing a game placard, empty Amaray box, or slip to a Customer Service Representative at step 90. The Customer Service Representative initiates the manufacturing process by scanning the bar code, for example, from the empty box or slip at step 92. The LCD panel 72 in the GP optionally, or as one example, prompts the CSR for an appropriate cartridge 18 at step 94. The game programming system checks for a proper cartridge (design, type, and density) after the cartridge is inserted by the Customer Service Representative (CSR) at step 96. Once the steps of obtaining and identifying a proper cartridge through steps 98, 100, 102, 96 and back to 98 are completed, the LCD panel 72 prompts the CSR to erase the cartridge 16 at steps 104 and 106 if a game is present. If none is present, step 108 provides for the system to begin writing the game cartridge and sends, information to the printer 24. The printer 24 produces identification and instructional inserts for the game. Once assembled and completed, i.e., at step 110, the customer service representative gives the completed game to the customer and the transaction is completed.

As hereinbefore stated the game programming system can be modified to program other types of data cartridges. Further, the system is not limited to programming game cartridges.

In a retail store setting a customer reviews and selects a game for manufacture at a game kiosk. The game kiosk may comprise a monitor with preferably a touch screen graphical user interface, although a keyboard serves as a reasonable alternative. The user selects or identifies, in order, (1) the type system the customer has, or chooses to browse games available for purchase or rental; e.g. Sega, Nintendo etc., (2) then selects a category of those games available., i.e. sports, combat, children's etc. and (3) then proceeds to browse the titles and view a short clip showing the characters involved and/or a brief description of the game, including the graphics associated with the games' front cover.

Once the customer has made a decision to select a particular game or games, those selections are made on the touch screen and an order slip is printed out. A slip printer is included ad part of the kiosk. The slip is given to the customer service representative (CSR) at the front or retail check-out desk where a point-of-sale register or terminal is located. The printed slip may contain a printed game title and/or a bar code. The bar code contains at least the necessary information concerning the selected game; i.e. the game identifier (ID) or part number. The CSR then processes the slip with the bar code part number at a game storage computer and the slip is scanned, such as by a bar code scanner, into the game storage computer to give the necessary initiating indicia for identification of the game and for the game to be manufactured. Concurrently, an appropriate cartridge is placed into the game programmer 16 ("ROM burner") which reads any information contained in the cartridge. If, for example, the cartridge had been previously rented and contains another game in flash memory plus other cartridge and source information, steps 96, 98, 100 and 102 of FIG. 9 are invoked. In that event, a portion of the flash memory includes complete inventory information, and that cartridge flash memory must be erased before being reloaded, as hereinafter explained with regard to FIG. 11.

The steps for writing, whether it be a game or other program, are more fully described with reference to FIG. 10. Optionally, the content to be written may be encrypted and/or compressed as a file. This is more fully discussed with regard to FIGS. 12–14. In step 120 (of FIG. 10) the application 112 opens a file with content from the storage 10 FIG. 1 which is intended for the flash memory 30 and 32. The application 112 then, in step 122, passes the pointer to the file contents to the device driver Application Program Interface (API) as set forth in FIG. 7. Step 124 provides for the device driver API to break the contents for the flash memory 30 and 32 into 1 Kbyte blocks and passes each block individually to the device driver. As earlier explained in FIG. 7, step 126 provides for the device driver to write the data to FIFO 62. The sequencer 64 reads the data, in step 128, from FIFO 62. The data is then written by the sequencer 64 to the flash memory 30 and 32 in step 130. The checksum operation previously discussed with regard to FIG. 6, is then carried out by the sequencer 64 to verify the status of the write operation in step 132. The sequencer 64, at this point or step 134, returns the results to the device driver. However, if more than one 1 kbyte block needs to be processed, then steps 126–134 are repeated until all blocks are processed.

Figures 10, 11:
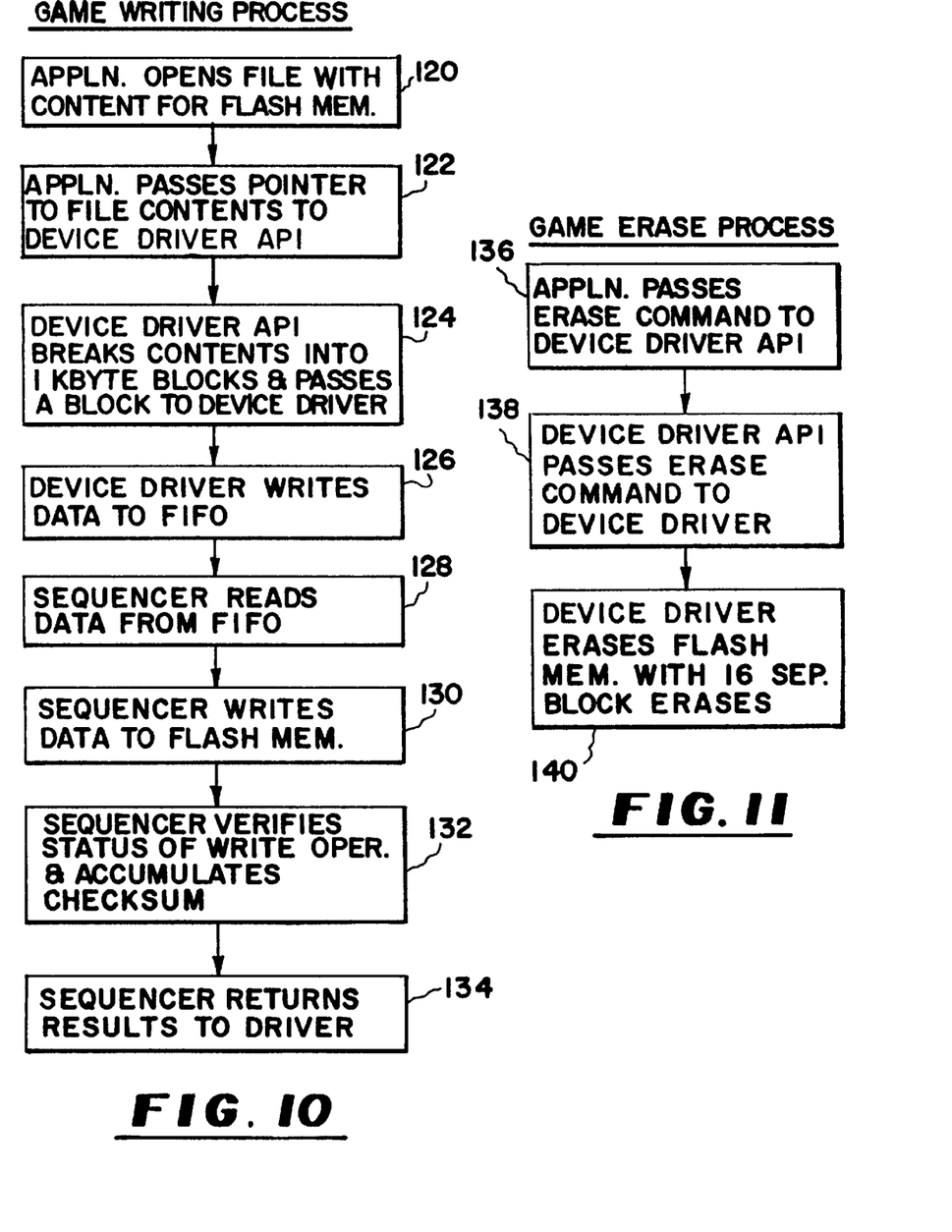
FIG. 10 is a logic flow diagram of the game writing process.
FIG. 11 is a logic flow diagram of the game erase process.

The game erase process, as hereinbefore discussed with regard to FIG. 9, and in particular steps 104 and 106, is now more fully described with regard to FIG. 11. The erase process is dependent on the flash memory parameters present, but in general requires the application 112 to pass the erase command to the device driver API, as covered by FIG. 7, and as set forth in step 136 of FIG. 11. That command is passed through by the device driver API to the device driver in step 138. At step 140, the device driver acts to erase the flash memory 30 and 32 with 16 separate block erases as was hereinbefore presented. This is dependent on the selected flash memory. Assuming, however, that the flash memory in the cartridge is empty, a pre-activity to the game burning activity is the placement of the bar code on a paste-on strip or the like, and the placement in the cartridge of additional information. This includes another slip with bar code and in a small area of the flash RAM, the following information: (1) the store identifier, (2) the cartridge serial number, (3) the "kind" of cartridge it is, i.e. Sega, Nintendo, etc. and (4) the game part number, is incorporated. During cartridge programming, this same information is also placed or written into the flash memory of the cartridge and is included on the instruction sheet. The cartridge and theinstruction sheet are packaged by the Customer Service Representative. Also, the information is sent to the local store computer, or point of sale computer (i.e. an IBM Mod. 90 computer) which captures all of the information concerning the game to be replicated. This information, in addition to information on check-in/check-out status for rental cartridges is considered transactional information.

In certain retail establishments (e.g. Blockbuster Video stores) the transactional information is transmitted, for example, once per day, or at other convenient intervals and times to the computer at, for example, headquarters of the retail operation. The point-of-sale computer audits the transmission back to the game computer to determine if there is any missing or incorrect information. As, for example, if the store number is incorrect, the point-of-sale computer will send an error code indicating that another cartridge should be placed in the game programmer 16. This would also be true if the cartridge contained, for example, an invalid cartridge serial number.

The CSR, also, at the point-of-sale register or monitor, further processes the package instruction and programmed game cartridge. There the cartridge rental information, i.e., the part number, and various identification numbers plus any additional information, e.g., the customer's name, address, may be stored and printed out on a receipt, including rental/sale price, and may also be sent to the local store computer and matched with the information concerning the cartridge I.D. and part number already received by the local store computer.

As is easily recognized from the foregoing description, there is no requirement that the POS register or terminal be directly connected to the game storage computer. However, that is possible and even may be advantageous depending upon the particular store arrangement in order to enhance and automate the commencement of the game-loading and cartridge programming activity.

The game computer has stored therein, for example, in hard-drives, compact disc read-only memories (CDROMs), tape or other local storage media, the game content for all of the games which may be produced. A protection system for the file content is discussed hereinafter with regard to file security. After the game-to-be-produced information or indicia is provided to the game storage computer, and a new or used cartridge is installed, the sequence of loading the game and additional identifying information into the flash memory 30 and 32 is commenced.

Also further connected to the separate or game storage computer, by way of example a telephone line is a host game computer which serves to update the directory of the game computer and run remote diagnostics if necessary. The host computer also functions to download and store new or modified games for later transmission to the game storage computer and also provides for the transmission of other data.

In the game manufacturing system a timer is operating and counting down whenever the game burning application is operational. In addition, a time counter provides for either a preset time and duration or for a predetermined time period for completing, in addition to burning, connect time. Periodically, a connection between the game storage computer and the host computer, which could be remotely located, is attempted, as, for example, by a modem, satellite or direct line. The system functions in a manner that if a timely connection is not made or is terminated prematurely between the host and the game storage computers, the game burner application time counter, that is always running, will not be reset by the other necessary and regularly transmitted data, such as the accounting data, and the system will only operate for the period of time remaining in the counter and then will cease to function. If the broken connection is not caused by the operator, whether accidentally or otherwise, the operator can request from the host computer a back up password, which will provide a grace period or pardon to enable a temporary and usually short, but extra, time period of selected duration for normal operation of the game burning application. This provides some reasonable time between connections, but will not permit the game burner application to run without first transmitting sufficient support data to and from the host computer within set scheduled time periods or before prolonged periods of time have elapsed.

Accounting for business activities when the game computer connection to the host is made must be done in a timely manner to maintain accountability and to be in accordance with accepted accounting practices. The game burning application will not operate after the two selected periods of time have passed. However, it will reset to normal operation if the connection is resumed and all other data, including support data, is transmitted between the game storage computer and the host system.

Figure 12:
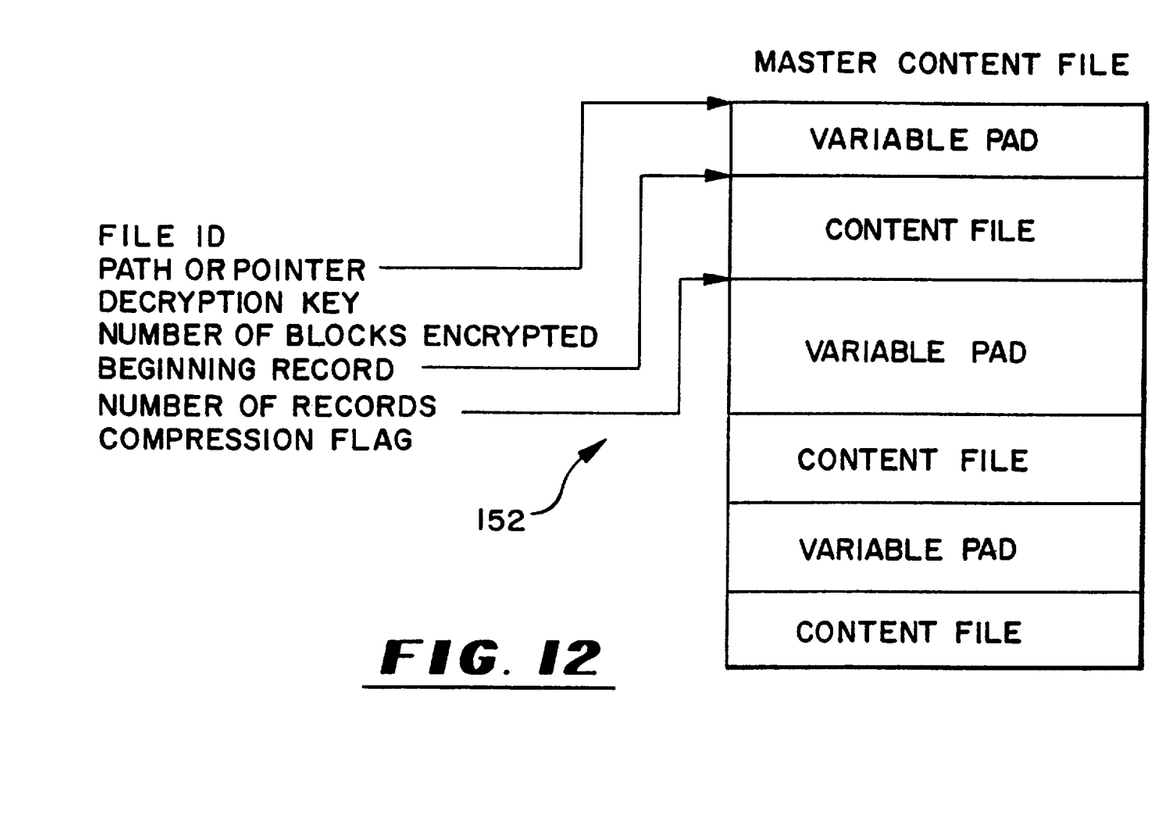
FIG. 12 is a schematic block diagram of a Master Content File for encryption.
Figure 13:
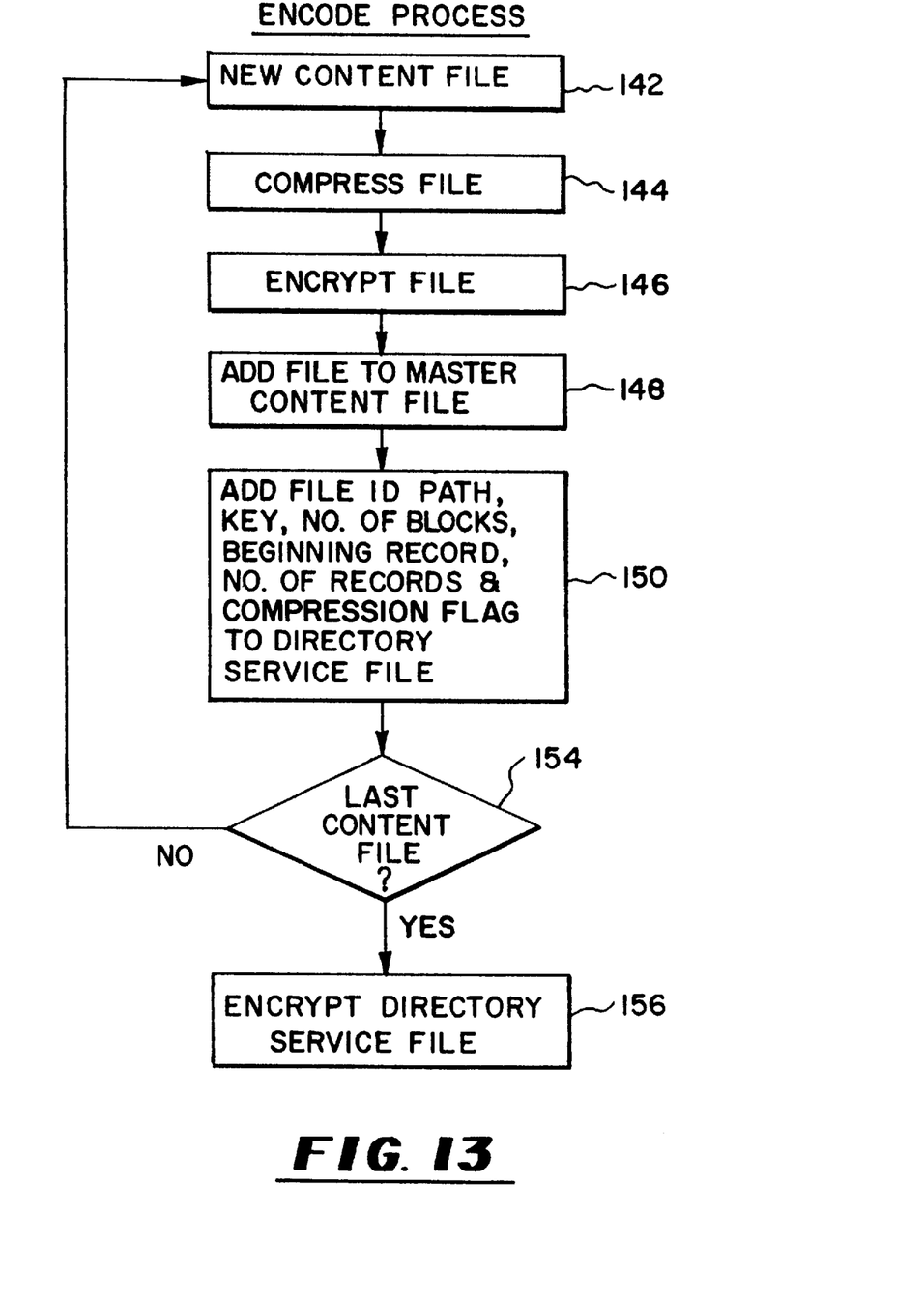
FIG. 13 is a logic flow diagram for encryption of a Content File.
Figure 14:
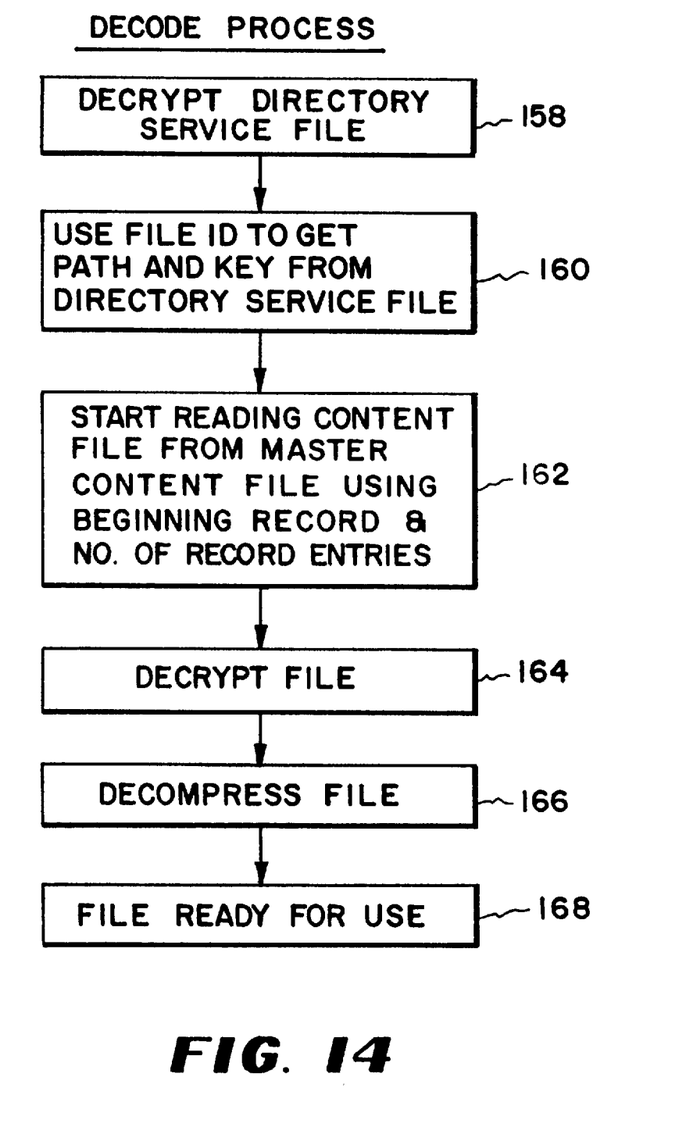
FIG. 14 is a logic flow diagram for decryption of a Content File.

Presented in FIGS. 12–14 is a security process with variations for protecting a computer file from unauthorized access or reading. A number of levels are incorporated to conceal the data and its location on a storage medium. The process incorporates an encrypted directory service file which contains pointers to the actual video game content file and a key for decrypting the content file. The content files are encrypted and can be compressed as well, which comprises an optional step in the process. This method is also applicable regardless of the storage medium employed such as CD-ROM, hard disk or via network connection. The video game content files are processed as set forth in FIG. 13. FIG. 13 provides initially for creating a content file base and a Directory Service file by identifying at step 142 a new content file. An optional step 144 provides for compressing the content file. This video compression is carried out following algorithms well known in the art. The next step 146 provides for encrypting the content file, using well known encryption methods. Step 148 provides for creating a master disk file of content file(s) or to copy the content file to storage medium. Thereafter, at step 150 a directory file entry for each content file is created and includes: file ID, pointer/path to content file, decryption key, number of blocks encrypted, beginning record, number of records and a compression flag.

This is illustrated in block form as a Master Content File 152 in FIG. 12. Once all content files are processed, as decided at step 154 in FIG. 13, the Directory Service file is encrypted at step 156.

Accessing and reading of the content file is set forth in the steps of FIG. 14. Decryption of the Directory Service file transpires at step 158. At step 160 the file ID is used to get the path and key from the Directory Service file for locating the content file. It obviously follows that the content file in then read at step 162 in order to start decrypting the content file at step 164. If the option of compression was practiced at step 144, step 166 decompresses the content file presenting a file ready for use at step 168. The Directory Services file generated at step 150 of FIG. 13 can be encrypted through public key (asymmetric) or private key (symmetric) encryption. Content files are stored separately and can be encrypted via private key (symmetric) encryption. Private key or symmetric encryption means that the sender and receiver each know the key privately and the same key will be used for encryption and decryption. However, public key or asymmetric encryption adds a level of security. The public encryption key is publicly known e.g. by several people. A special software program is used by the intended recipient of the information. With the special program a public key is randomly generated along with a private key, which private key is created by and for one user, the recipient, and only the recipient will know that private key. The private key has a mathematical relationship with the randomly generated public key and each is a function of the other. The recipient uses the private key for decryption only. The sender receives the public key from the intended recipient, the person who is to receive the information, and the sender can enter the public key for encryption only.

This method adds an additional level of security by putting all content files inside of a master content file with variable and random pads for additional obfuscation of the content file's starting and ending points.

While the invention has been particularly shown and described with reference to a detailed description, it will be understood by those skilled in the art that various changes in form and detail may be made therein without departing from the spirit and scope of the invention.

---

© Copyright 1994 Fairway Technologies All Rights Reserved
TYPICAL OPERATION
FLASH WRITE OPERATION
PC software
  1: PC software write to CNTL reg to activate SEQ-Code
  2: Keep Load FIFO with Game content and monitor FIFO status to avoid FIFO overflow condition.
  3: When at End of Game (EOG), write to CNTL to signal SEQ that EOG is reached.
  4: Check for SEQ DONE status and other ERROR status if present.
  5: End program and SEQ-Code.

-continued

```
SEQ CODE
 1: CNTL-OUT = inactive
 2: ADR-OUT = 0
 3: DATA-IN = write command
 4: CNTL-OUT = write sequence
 5: JMP-ADR = 12
 6: BIT-TEST, FIFO not empty?        (jump to 12: if not
                                      empty)
 7: JMP-ADR = 5
 8: BIT-TEST, not E.O.G.?            (jump to 5: if not
                                      E.O.G.)
 9: STAT_REG = Report STATUS & DONE
10: JMP-ADR = 11                     (End SEQ code)
11: BIT-TEST, always true            (jump to 11:, loop to
                                      itself forever)
12: DATA-OUT = FIFO
13: CNTL-OUT = write sequence
14: CNTL-OUT = Read sequence
15: JMP-ADR = 16
16: BIT-TEST, Flash Status not ready (jump to 16: if
                                      Status = not ready)
17: ADR-OUT = increment
18: JMP-ADR = 3
19: BIT-TEST, always true            (jump to 3:)
FLASH READ OPERATION
PC software
 1: PC software read game content from PC storage and calculate check-
    sum
 2: Write check-sum to PC CHKSUM
 3: Write to CNTL to signal SEQ that check-sum was loaded and start
    read operation to compare check-sum
 4: Check for SEQ DONE status, check status, and HW check-sum
 5: End program and SEQ-Code
SEQ CODE
 1: CNTL-OUT = inactive
 2: ADR-OUT = Game Ending address
 3: CNTL-OUT - Read sequence
 4: FLASH CHK-SUM = Calculate check-
    sum
 5: JMP-ADR = 10
 6: BIT-TEST, ADR-OUT = 0?           (ADR-OUT = 0,
                                      game is read completely)
 7: ADR-OUT = decrement              (Decrement address by 1)
 8: JMP-ADR = 4
 9: BIT-TEST, always true            (jump to 4:)
10: STAT_REG = Report STATUS & Done
11: JMP-ADR = 12                     (End SEQ code)
12: BIT-TEST, always true            (jump to 12:, loop;
                                      to itself forever)
```

What is claimed is:

1. A programmable cartridge system for recording a computer program on a reprogrammable cartridge comprising:

a reprogrammable cartridge housing a non-volatile flash memory which may be programmed, erased and reprogrammed with computer programs via a plug-in connector;

a programmer for receiving the plug-in connector and engaging the reprogrammable cartridge to enable the flash memory to be loaded with a computer program;

a personal computer, including a microprocessor and a storage device for storing computer programs for loading in the flash memory and generating microcode for controlling the reprogrammable cartridge game format;

scanner means for entering into the system customer order information identifying a specific cartridge type and a specific one of the computer programs stored in the storage device;

identification hardware means for (a) verifying that the identifying information in the cartridge corresponds to said specific cartridge type and (b) providing a cartridge verification signal to the programmer to record a computer program in the reprogrammable cartridge; and sequencer means for (a) writing the specific computer program into the flash memory when verification of the identifying information in the cartridge has occurred, and (b) responding to the microcode supplied by the personal computer for controlling the reprogrammable cartridge game format for the programmer.

2. A programmable cartridge system for recording a computer program on a programmable cartridge comprising:

a reprogrammable cartridge having a flash memory which may be programmed, erased, and reprogrammed with computer programs in accordance with a game format;

a programmer that receives the reprogrammable cartridge to enable the flash memory of the reprogrammable cartridge to be loaded with a computer program;

a computer having a processor and a storage device for storing computer programs to be loaded into the flash memory and generating microcode for controlling the game format of the reprogrammable cartridge;

scanner means for entering into the system customer order information identifying a specific cartridge type and a specific one of the computer programs stored in the storage device;

array logic identification hardware in the cartridge responsive to a specific data stream applied thereto by the programmer for verifying the cartridge as proprietary and for enabling write logic of the flash memory upon successful verification; and sequencer means for (a) receiving a disable signal from the reprogrammable cartridge when an incorrect data stream is received by the reprogrammable cartridge and sending a stop signal to the programmer and (b) writing the specific computer program into the flash memory when successful verification of the reprogrammable cartridge has occurred.

3. A programmable cartridge system for recording computer programs on reprogrammable cartridges comprising:

reprogrammable cartridges, each having a flash memory which may be programmed, erased, and reprogrammed with computer programs in accordance with a game format, each cartridge having stored in the flash memory thereof information identifying its cartridge type and including further means for (a) generating a disable signal when the cartridge is not acceptable for programming and (b) generating a cartridge verification signal when the cartridge is acceptable for programming;

a computer having a processor and a storage device for storing computer programs to be loaded into the flash memories of the cartridges and for storing cartridge type information;

a programmer, each of the cartridges being adapted for manual insertion into the programmer;

a scanner for entering into the system customer order information identifying a specific one of the computer programs stored in the storage device and identifying a specific cartridge type into which the specific computer program is to be recorded;

means including the computer, the programmer, and a cartridge manually inserted into the programmer for verifying that the identifying information in the manually inserted cartridge corresponds to said specific cartridge type and sending the cartridge verification signal to the programmer;

means in the programmer and the manually inserted cartridge for verifying the manually inserted cartridge as proprietary and for enabling said write logic of the flash memory when successful verification of the cartridge has occurred; and sequencer means for (a) recording the specific computer program in the flash memory of the manually inserted cartridge (incident to) when successful verification of the identifying information and verification of the inserted cartridge has occurred and (b) responding to microcode from the computer for controlling the game format of the cartridge.

4. The programmable cartridge system of claim 3, further comprising:

program controlled means effective upon the successful verification of the manually inserted cartridge as proprietary for determining whether or not a manually inserted cartridge has a previously stored computer program stored therein; and program controlled means for erasing said previously stored computer program prior to said recording of said specific computer program in the manually inserted cartridges.

5. The programmable cartridge system of claim 3 wherein the means for verifying the manually inserted cartridge as proprietary comprises:

software driver means including the programmer for sending a specific data stream to the manually inserted cartridge; and array logic means in the manually inserted cartridge for verifying that the specific data stream has been received from the programmer and sending the cartridge verification signal to the programmer when verification has occurred or sending a disable signal to the sequencer means when verification does not occur.

6. The programmable cartridge system of claim 3, further including cartridge initialization apparatus wherein:

said means for verifying the blank cartridge as proprietary operable for enabling the write logic of the flash memory when successful verification of the cartridge has occurred; and sequencer means including the programmer for enters said certain information into the flash memory, thereby initializing said blank cartridge.

7. A game programming system for storing a program in a rewritable cartridge comprising:

(a) the rewritable cartridge containing storage means and cartridge identification means generating a cartridge verification signal or a disable signal according to an input signal;

(b) a game programmer for receiving at least one rewritable cartridge having a proprietary design and generating the input signal indicative of the proprietary design for the at least one received rewritable cartridge; the game programmer transferring the program into the received rewritable cartridge in response to the cartridge verification signal provided by the rewritable cartridge upon a correct input signal from the game programmer;

(c) a computer system for storing the program and microcode indicative of the proprietary design of each rewritable cartridge received by the game programmer; and (d) an interface unit coupling the computer system to the game programmer, the interface unit including sequencing means responsive to the microcode supplied by the computer system for transferring the program from the computer system via the game programmer to the received rewritable cartridge identified by the microcode unless the disable signal is received from the rewritable cartridge whereupon the sequencer issues a stop transfer order to the game programmer.

8. The system of claim 7 further including means in the rewritable cartridge for retaining the memory in an inactive or passive state until the correct input signal is received by the rewritable cartridge.

9. The system of claim 7 further including a first-in-first-out storage register in sequencer for transferring program data from the computer system to the rewritable cartridge.

10. The system of claim 7 wherein the sequencer includes means for writing of the program from the storage register to the memory in the rewritable cartridge; calculation and comparison of a program checksum to verify write operations, and reading of program data from the memory in the rewritable cartridge to the storage means.

11. The system of claim 7 further including in the sequencer a storage device for holding game tally results and logic means for selecting between the storage means and the memory in the rewritable cartridge.

12. The system of claim 7 further including means for modifying the microcode to accommodate different proprietary designs for rewritable cartridges and different types of memories in the rewritable cartridges.

13. The system of claim 7 further including means for encrypting and/or compressing the program stored in the computer system.

14. The system of claim 7 further including means for decrypting encrypted programs stored in the computer system.

15. The system of claim 7 further including means in the computer system for erasing program data stored in the memory of the rewritable cartridge.

16. The system of claim 7 wherein the memory is flash memory technology.

17. The system of claim 7 further including a device driver in the computer system for downloading the microcode to a logic means in the sequencer.

* * * * *